United States Patent
Chung

(10) Patent No.: US 7,248,091 B2
(45) Date of Patent: Jul. 24, 2007

(54) SEMICONDUCTOR DEVICE HAVING DELAY DRIFT COMPENSATION CIRCUIT THAT COMPENSATES FOR DELAY DRIFT CAUSED BY TEMPERATURE AND VOLTAGE VARIATIONS IN CLOCK TREE

(75) Inventor: In-Young Chung, Junji-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/324,951

(22) Filed: Jan. 4, 2006

(65) Prior Publication Data

US 2006/0152260 A1    Jul. 13, 2006

(30) Foreign Application Priority Data

Jan. 10, 2005 (KR) .................. 10-2005-0002049

(51) Int. Cl.
*H03H 11/26* (2006.01)
(52) U.S. Cl. ...................... 327/262; 327/158
(58) Field of Classification Search ............... 327/158, 327/161, 262, 284, 285, 378, 513
See application file for complete search history.

(56) References Cited

U.S. PATENT DOCUMENTS

| | | | |
|---|---|---|---|
| 5,994,937 A * | 11/1999 | Hara et al. .................. 327/262 |
| 6,150,862 A * | 11/2000 | Vikinski ...................... 327/262 |
| 6,294,938 B1 | 9/2001 | Coddington et al. ........ 327/158 |
| 6,417,715 B2 * | 7/2002 | Hamamoto et al. ......... 327/291 |
| 6,700,414 B2 * | 3/2004 | Tsujino .......................... 327/3 |
| 6,727,739 B2 * | 4/2004 | Stubbs et al. ............... 327/161 |
| 6,819,157 B2 * | 11/2004 | Cao et al. ................... 327/262 |
| 6,882,580 B2 * | 4/2005 | Lim et al. .............. 365/189.05 |
| 7,046,060 B1 * | 5/2006 | Minzoni et al. ............ 327/158 |

FOREIGN PATENT DOCUMENTS

JP      09-307431      11/1997
KR      100232018       2/1999

\* cited by examiner

*Primary Examiner*—Timothy P. Callahan
*Assistant Examiner*—Hai L. Nguyen
(74) *Attorney, Agent, or Firm*—F. Chau & Assoc., LLC

(57) ABSTRACT

A semiconductor device having a delay drift compensation circuit that compensates for a delay drift caused by temperature and voltage variations in a clock tree includes a clock driver having an output port, a first circuit having an input port, a first signal path between the output port of the clock driver and the input port of the first circuit and a first delay drift compensation circuit. The first delay drift compensation circuit, which is coupled with the first signal path, reduces a delay time of the first signal path when a power supply voltage increases, and increases the delay time of the first signal path when a temperature increases.

8 Claims, 3 Drawing Sheets

SEMICONDUCTOR DEVICE HAVING DELAY DRIFT COMPENSATION CIRCUIT THAT COMPENSATES FOR DELAY DRIFT CAUSED BY TEMPERATURE AND VOLTAGE VARIATIONS IN CLOCK TREE

CROSS-REFERENCE TO RELATED PATENT APPLICATION

This application claims priority to Korean Patent Application No. 10-2005-0002049, filed on Jan. 10, 2005, the disclosure of which is herein incorporated by reference in its entirety.

BACKGROUND OF THE INVENTION

1. Field of the Invention

The present invention relates to a semiconductor device and, more particularly, to a delay drift compensation circuit that compensates for delay drift caused by temperature and voltage variations in a clock tree.

2. Description of the Related Art

In general, high-speed memory devices, such as synchronous DRAMs, operate in synchronization with an external clock signal. As the speed of clock signals has continued to increase with advances in semiconductor fabrication techniques, delay-locked loops (DLLs) or phase-locked loops (PLLs) have been used to reduce skew (time offset) between clocks.

A DLL receives a reference clock signal from an external source, generates an internal clock signal and synchronizes it to the reference clock signal, and provides the internal clock signal to an input and output circuit of a memory device. A conventional DLL includes a clock driver and a phase detector. The time required for transmitting the internal clock signal from an output port of the clock driver to an input port of the phase detector is referred to as feedback path delay. The time required for transmitting the internal clock signal from an output port of the clock driver to the input and output circuit is referred to as clock distribution path delay. It may be preferable that the feedback path delay be equal to the clock distribution path delay.

A clock distribution path is generally long. To make the feedback path delay equal to the clock distribution path delay, the feedback path and clock distribution path can be designed to be the same length. However, a long feedback path increases the layout area of a DLL and the power consumption of a clock driver. The increased power consumption of the clock driver can considerably deteriorate a noise environment of the DLL.

The feedback path delay may be increased to equal the clock distribution path delay, for example, by reducing the feedback path length and by installing a loading capacitor on the feedback path. However, the feedback path delay can differ from the clock distribution path delay due to temperature and voltage variations in the clock tree.

For example, as the temperature increases, the clock distribution path delay increases, because the resistance of the clock distribution path increases with temperature. However, the increase in feedback path delay may not be proportional to the increase in the clock distribution path delay. The phase of the internal clock signal generated by the DLL may undesirably drift with temperature and voltage variations in the clock tree.

SUMMARY OF THE INVENTION

Exemplary embodiments of the present invention provide a semiconductor device having at least one delay drift compensation circuit.

In one aspect of the present invention, the semiconductor device includes: a clock driver having an output port; a first circuit having an input port; a first signal path between the output port of the clock driver and the input port of the first circuit; and a first delay drift compensation circuit, wherein when a power supply voltage increases the first delay drift compensation circuit reduces a delay time of the first signal path, and wherein when a temperature increases the first delay drift compensation circuit increases the delay time of the first signal path.

The first delay time drift compensation circuit may include: a PMOS transistor having a first terminal, a second terminal, and a PMOS gate coupled to receive a ground voltage, wherein one end the first terminal is coupled with the output port of the clock driver, and the second terminal is coupled with the input port of the first circuit; and an NMOS transistor having a third terminal, a fourth terminal, and an NMOS gate coupled to receive a power supply voltage, wherein the third terminal is coupled with the output port of the clock driver, and the fourth terminal is coupled with the input port of the first circuit.

According to an exemplary embodiment of the present invention, the semiconductor device includes a second delay drift compensation circuit coupled with the first signal path, wherein when a temperature increases the second delay drift compensation circuit increases the delay time of the first signal path.

The second delay drift compensation circuit may include: a P-type capacitor coupled to receive the power supply voltage; a PMOS transistor having a first terminal, a second terminal, and a PMOS gate coupled to receive a ground voltage, wherein the fifth terminal is coupled with the P-type capacitor, and the sixth terminal is connected to a predetermined portion on the first signal path; an N-type capacitor coupled to receive the ground voltage; and an NMOS transistor having a seventh terminal, an eighth terminal and a PMOS gate to which the ground voltage is applied, wherein the seventh terminal is coupled with the N-type capacitor, and the eighth terminal is connected to a predetermined portion on the first signal path.

In another aspect of the present invention, the semiconductor device includes: a delay chain coupled to receive a reference clock signal and coupled to receive a control signal for controlling the delay chain, wherein the delay chain delay the reference clock signal; a clock driver having a output port and coupled to receive an output signal of the delay chain, wherein the clock driver outputs an internal clock signal; a phase detector having a input port and coupled to receive the reference clock signal and a compensated internal clock signal, wherein the phase detector detects a difference between the phase of the reference clock signal and the phase of the compensated internal clock signal; a control circuit coupled to receive an output signal of the phase detector, wherein the control circuit generates the control signal; a feedback path between the output port of the clock driver and the input port of the phase detector, wherein the feedback path receives the internal clock signal, and outputs the compensated internal clock signal; an input and output circuit configured to receive and output data; a clock distribution path between the output port of the clock driver and an input port of the input and output circuit; and a first delay drift compensation circuit coupled with the feedback path, wherein when a power supply voltage increases the first delay drift compensation circuit reduces a delay time of the feedback path, and wherein when a temperature increases the first delay drift compensation circuit increases the delay time of the feedback path.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Hereinafter, exemplary embodiments of the present invention will be described in detail with reference to the accompanying drawings.

Figure 1:
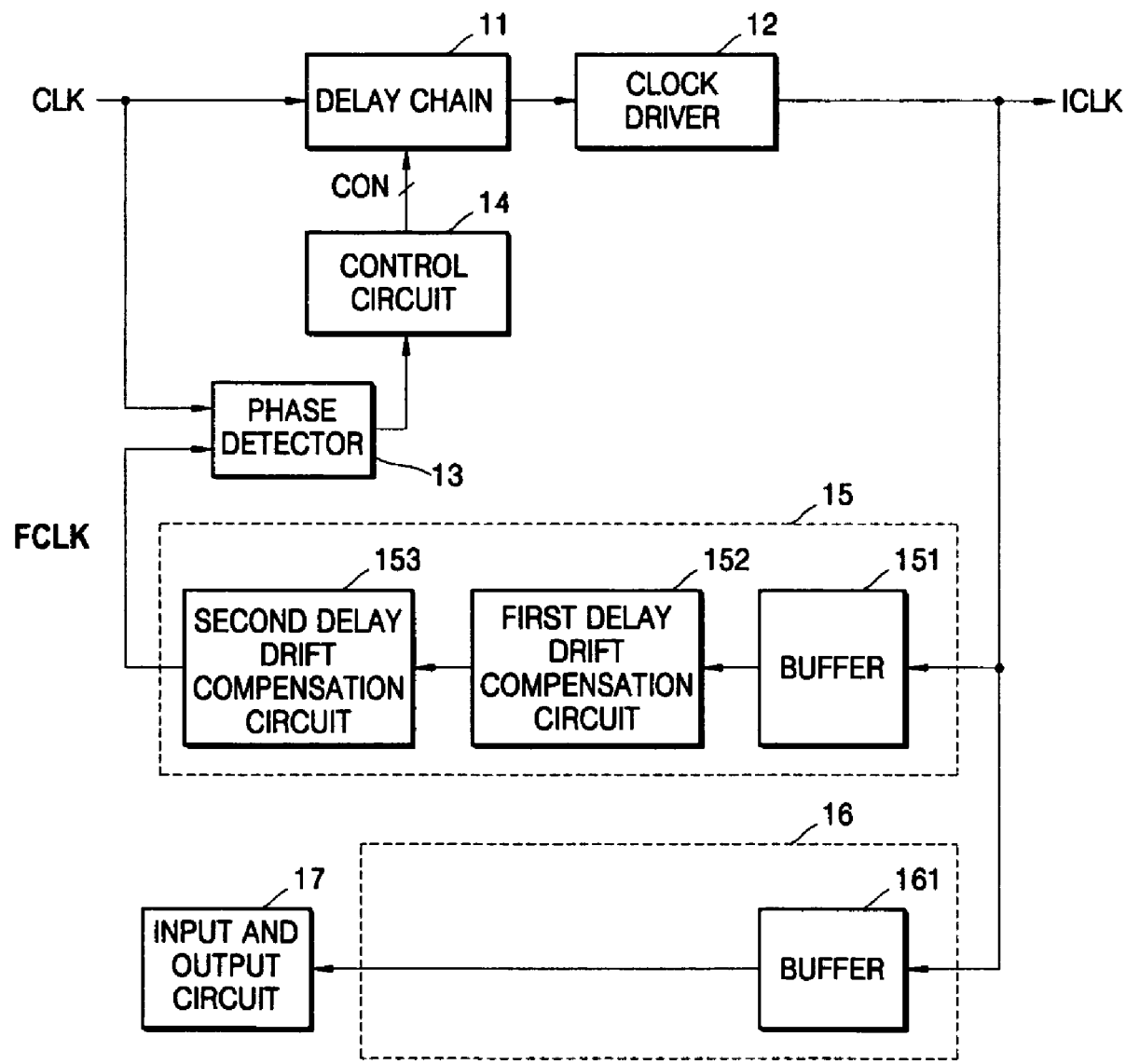
FIG. 1 is a block diagram illustrating a semiconductor device according to an exemplary embodiment of the present invention.

FIG. 1 is a block diagram of a semiconductor device according to an exemplary embodiment of the present invention. Referring to FIG. 1, the semiconductor device includes a DLL, comprising a delay chain 11, a clock driver 12, a phase detector 13, a control circuit 14, and a feedback path 15. An output port of the clock driver 12 is coupled with an input and output circuit 17 via a clock distribution path 16.

The delay chain 11, which is also called a delay line, is controlled using a control signal CON. The control signal CON is generated by the control circuit 14. The delay chain 11 receives a reference clock signal CLK from an external source and delays the reference clock signal CLK. The clock driver 12 receives a signal from the delay chain 11 and outputs an internal clock signal ICLK.

The phase detector 13 receives the reference clock signal CLK and a feedback clock signal FCLK, which is obtained by compensating for the phase of the internal clock signal ICLK through the feedback path 15, and detects a difference between the phase of the reference clock signal CLK and the phase of the feedback clock signal FCLK. The control circuit 14 receives an output signal of the phase detector 13 and generates the control signal CON.

The feedback path 15 is connected between an output port of the clock driver 12 and an input port of the phase detector 13. As shown in FIG. 1, the feedback path 15 includes a buffer 151, a first delay drift compensation circuit 152, and a second delay drift compensation circuit 153. It is to be understood that the feedback path 15 may include only one of the delay drift compensation circuits shown in FIG. 1, or the feedback path 15 may include more than two delay drift compensation circuits. In an embodiment of the present invention, the feedback path 15 does not include the buffer 151.

The buffer 151 receives the internal clock signal ICLK from the clock driver 12, buffers the internal clock signal ICLK, and outputs the buffered internal clock signal ICLK. The first delay drift compensation circuit 152 is designed to reduce the feedback path delay when a power supply voltage increases, and to increase the feedback path delay when temperature increases. The second delay drift compensation circuit 153 is designed to increase the feedback path delay when temperature increases.

The feedback path delay is appropriately compensated for according to temperature and voltage by passing the internal clock signal ICLK through the first and second delay drift compensation circuits 152 and 153. As a result of the compensation, the feedback clock signal FCLK is generated.

Figure 2:
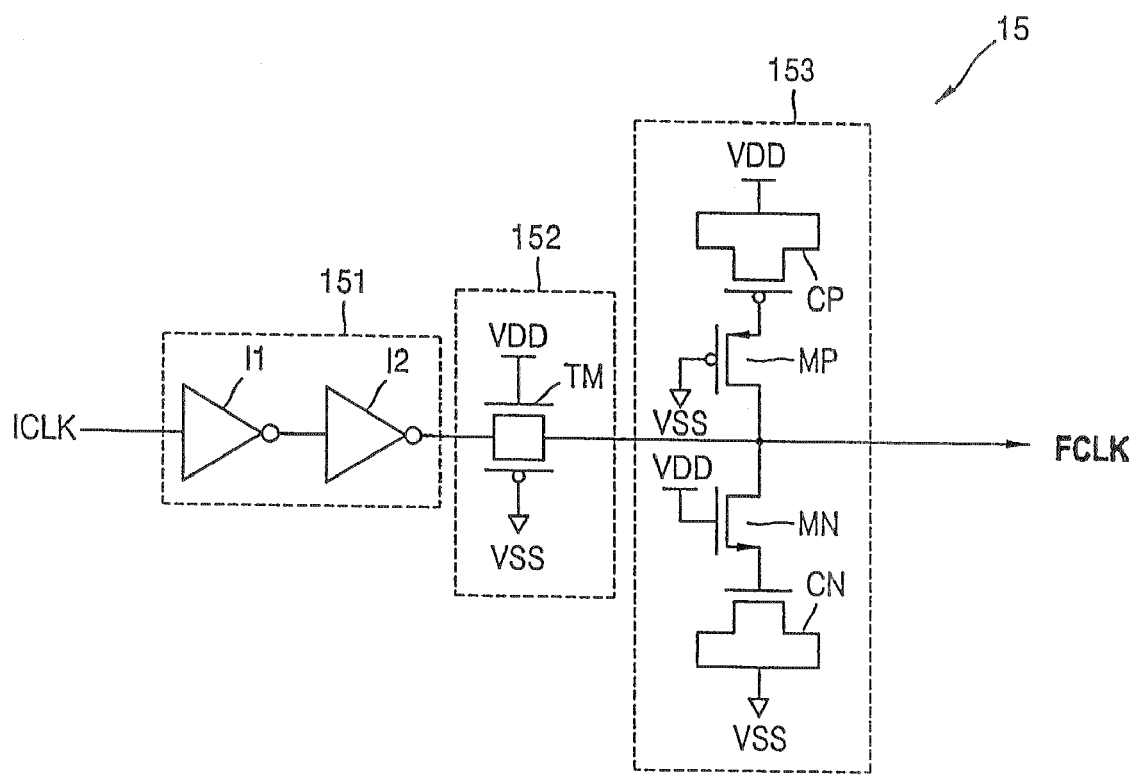
FIG. 2 is a circuit diagram illustrating a buffer, a first delay drift compensation circuit, and a second delay drift compensation circuit of a feedback path of FIG. 1.

FIG. 2 is a circuit diagram illustrating the buffer 151, the first delay drift compensation circuit 152, and the second delay drift compensation circuit 153 of the feedback path 15 of FIG. 1. Referring to FIG. 2, the buffer 151 includes inverters arranged in multiples of 2, for example, inverters 11 and 12. The first delay drift compensation circuit 152 includes a transmission gate TM. The first delay drift compensation circuit 152 includes a PMOS transistor having a first terminal, a second terminal, and a PMOS gate coupled to receive a ground voltage. The first terminal is coupled with the output port of the buffer 151, and the second terminal is coupled with the input port of the phase detector 13. The first delay drift compensation circuit 152 includes an NMOS transistor having a third terminal, a fourth terminal, and an NMOS gate coupled to receive a power supply voltage. The third terminal is coupled with the output port of the buffer 151, and the fourth terminal is coupled with the input port of the phase detector 13.

The second delay drift compensation circuit 153 includes a P-type capacitor CP, a PMOS transistor MP, an N-type capacitor CN, and an NMOS transkstor MN. One end of the P-type capacitor CP is connected to the power supply voltage VDD. The other end of the P-type capacitor CP is connected to one end of the PMOS transistor MP. The other end of the PMOS transistor MP is connected to a predetermined portion on the feedback path 15 between the output port of the buffer 151 and the input port of the phase detector 13. The ground voltage VSS is applied to a gate of the PMOS transistor MP.

The operation of the first and second delay drift compensation circuits 152 and 153 will now be described in further detail. The first and second delay drift compensation circuits 152 and 153 are used for compensating for a delay drift so that feedback path delay can be aligned with clock distribution path delay when temperature and/or voltage variations occur.

The second delay drift compensation circuit 153 takes advantage of the fact that a threshold voltage VT of a MOS transistor decreases with temperature. In the second delay drift compensation circuit 153, the voltage at a gate of the N-type capacitor CN swings between the ground voltage VSS and the difference of the threshold voltage VT and the power supply voltage VDD, i.e., VDD−VT. As the threshold voltage VT decreases, the range in which the voltage at the gate of the N-type capacitor CN swings increases, and the effective capacitance of the N-type capacitor CN increases due to the capacitance-voltage characteristics of the N-type capacitor CN. Accordingly, the load of the feedback path 15 increases. As temperature increases, feedback path delay increases.

The first delay drift compensation circuit 152 includes a PMOS transistor having a PMOS gate to which the ground voltage VSS is applied, and an NMOS transistor having an NMOS gate to which the power supply voltage VDD is applied. When the power supply voltage VDD increases, the first delay drift compensation circuit 152 reduces the load of the feedback path 15, reducing the feedback path delay. When temperature increases, the first delay drift compensation circuit 152 increases the load of the feedback path 15, increasing the feedback path delay.

Figure 3:
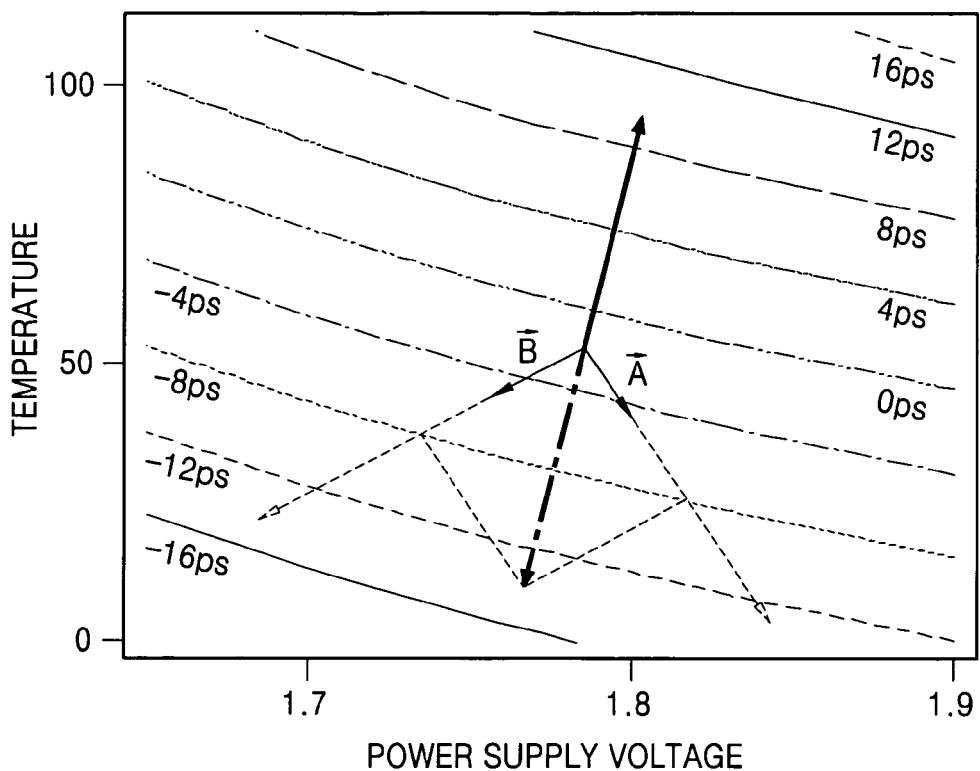
FIG. 3 is a counter plot illustrating the skew between feedback path delay and clock distribution path delay relative to changes in temperature and voltage in a case where the feedback path of FIG. 1 does not include the first and second delay drift compensation circuits.
Figure 4:
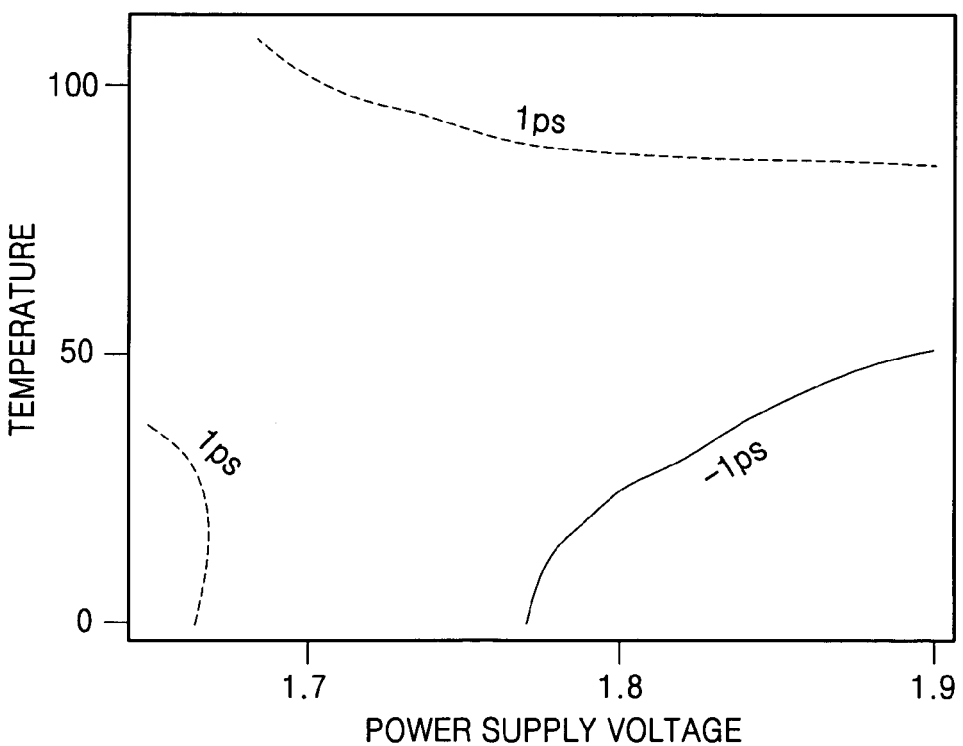
FIG. 4 is a counter plot illustrating the skew between feedback path delay and clock distribution path delay relative to changes in temperature and voltage in a case where the feedback path of FIG. 1 includes the first and second delay drift compensation circuits, according to an exemplary embodiment of the present invention.

FIG. 3 is a counter plot illustrating the skew between feedback path delay and clock distribution path delay relative to changes in temperature and voltage in a case where the feedback path 15 of FIG. 1 does not include the first and second delay drift compensation circuits 152 and 153. FIG. 4 is a counter plot illustrating the skew between feedback path delay and clock distribution path delay relative to changes in temperature and voltage in a case where the feedback path 15 includes the first and second delay drift compensation circuits 152 and 153. Referring to FIG. 3, the skew is generated between the feedback path delay and clock distribution path delay because of temperature and power supply voltage variations in a clock tree. The skew can be offset under every temperature-voltage condition illustrated in FIG. 3 by using a sum of vectors of the first and second delay drift compensation circuits 152 and 153, as shown in FIG. 4.

As described above, the semiconductor device according to the exemplary embodiments of the present invention can compensate for a delay drift by offsetting a skew between feedback path delay and clock distribution path delay using one or more delay drift compensation circuits.

Although exemplary embodiments of the present invention have been described in detail with reference to the accompanying drawings for the purpose of illustration and description, it is to be understood that the inventive processes and apparatus are not to be construed as limited thereby. It will be readily apparent to those of ordinary skill in the art that various modifications to the foregoing exemplary embodiments may be made without departing from the scope of the invention as defined by the appended claims, with equivalents of the claims to be included therein.

What is claimed is:

1. A semiconductor device comprising:
 a delay chain coupled to receive a reference clock signal and coupled to receive a control signal for controlling the delay chain, wherein the delay chain delay the reference clock signal;
 a clock driver having an output port and coupled to receive an output signal of the delay chain, wherein the clock driver outputs an internal clock signal;
 a phase detector having input ports and coupled to receive the reference clock signal and a compensated internal clock signal, wherein the phase detector detects a difference between the phase of the reference clock signal and the phase of the compensated internal clock signal;
 a control circuit coupled to receive an output signal of the phase detector, wherein the control circuit generates the control signal;
 a feedback path between the output port of the clock driver and the input port of the phase detector, wherein the feedback path receives the internal clock signal, and outputs the compensated internal clock signal;
 an input and output circuit configured to receive and output data;
 a clock distribution path between the output port of the clock driver and an input port of the input and output circuit;
 a first delay drift compensation circuit formed as part of the feedback path, wherein when a power supply voltage increases the first delay drift compensation circuit reduces a delay time of the feedback path, and wherein when a temperature increases the first delay drift compensation circuit increases the delay time of the feedback path; and
 a second delay drift compensation circuit formed as part of the feedback path, wherein when a temperature increases the second delay drift compensation circuit increases the delay time of the feedback path.

2. The semiconductor device of claim 1, wherein the first delay time drift compensation circuit comprises:
 a PMOS transistor having a first terminal, a second terminal, and a PMOS gate coupled to receive a ground voltage, wherein the first terminal is coupled with the output port of the clock driver, and the second terminal is coupled with the first input port of the first circuit; and
 an NMOS transistor having a third terminal, a fourth terminal, and an NMOS gate coupled to receive a power supply voltage, wherein the third terminal is coupled with the output port of the clock driver, and the fourth terminal is coupled with the first input port of the first circuit.

3. The semiconductor device of claim 1, wherein the second delay drift compensation circuit comprises:
 a P-type capacitor coupled to receive the power supply voltage;
 a PMOS transistor having a fifth terminal, a sixth terminal and a PMOS gate to which the ground voltage is applied, wherein the fifth terminal is coupled with the P-type capacitor, and the sixth terminal is connected to a predetermined portion on the first signal path;
 an N-type capacitor coupled to receive the ground voltage; and
 an NMOS transistor having a seventh terminal, an eighth terminal and a PMOS gate to which the ground voltage is applied, wherein the seventh terminal is coupled with the N-type capacitor, and the eighth terminal is connected to the predetermined portion on the feedback path.

4. A semiconductor device comprising:
 a clock driver having an output port;
 a first circuit having an input port;
 a first signal path between the output port of the clock driver and the input port of the first circuit;
 a first delay drift compensation circuit formed as part of the first signal path, wherein when a power supply voltage increases the first delay drift compensation circuit reduces a delay time of the first signal path, and wherein when a temperature increases the first delay drift compensation circuit increases the delay time of the first signal path; and
 a second delay drift compensation circuit formed as part of the first signal path, wherein when a temperature increases the second delay drift compensation circuit increases the delay time of the first signal path.

5. The semiconductor device of claim 1, wherein the first circuit is a phase detector in either a delay-locked loop (DLL) or a phase-locked loop (PLL).

6. The semiconductor device of claim 1, further comprising an input and output circuit coupled with the output port of the clock driver.

7. The semiconductor device of claim 1, wherein the first delay time drift compensation circuit comprises:
- a PMOS transistor having a first terminal, a second terminal, and a PMOS gate coupled to receive a ground voltage, wherein the first terminal is coupled with the output port of the clock driver, and the second terminal is coupled with the input port of the first circuit; and
- an NMOS transistor having a third terminal, a fourth terminal, and am NMOS gate coupled to receive a power supply voltage, wherein the third terminal is coupled with the output port of the clock driver, and the fourth terminal is coupled with the input port of the first circuit.

8. The semiconductor device of claim 1, wherein the second delay drift compensation circuit comprises:
- a P-type capacitor coupled to receive the power supply voltage;
- a PMOS transistor having a fifth terminal, a sixth terminal and a PMOS gate to which the ground voltage is applied, wherein the fifth terminal is coupled with the P-type capacitor, and the sixth terminal is connected to a predetermined portion on the first signal path;
- an N-type capacitor coupled to receive the ground voltage; and
- an NMOS transistor having a seventh terminal, an eighth terminal and a PMOS gate to which the ground voltage is applied, wherein the seventh terminal is coupled with the N-type capacitor, and the eighth terminal is connected to the predetermined portion on the first signal path.

* * * * *